(12) United States Patent
Oda et al.

(10) Patent No.: US 8,970,249 B2
(45) Date of Patent: Mar. 3, 2015

(54) LOOK-UP TABLE CIRCUIT

(75) Inventors: Masato Oda, Yokohama (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 391 days.

(21) Appl. No.: 13/606,041

(22) Filed: Sep. 7, 2012

(65) Prior Publication Data

US 2013/0235688 A1   Sep. 12, 2013

(30) Foreign Application Priority Data

Mar. 8, 2012   (JP) ................................. 2012-052286

(51) Int. Cl.
*H03K 19/173*   (2006.01)

(52) U.S. Cl.
USPC ................ 326/38; 326/41; 365/200; 365/226

(58) Field of Classification Search
USPC .................. 326/37–41, 46; 365/200
See application file for complete search history.

(56) References Cited

U.S. PATENT DOCUMENTS

| | | | |
|---|---|---|---|
| 6,215,327 B1 * | 4/2001 | Lyke ............................... | 326/41 |
| 7,061,271 B1 * | 6/2006 | Young et al. .................... | 326/46 |
| 7,075,332 B1 * | 7/2006 | Young et al. .................... | 326/38 |
| 2005/0174144 A1 * | 8/2005 | Veredas-Ramirez et al. ... | 326/38 |
| 2012/0074984 A1 * | 3/2012 | Sugiyama et al. .............. | 326/45 |
| 2013/0257477 A1 * | 10/2013 | Yasuda et al. ................... | 326/38 |

FOREIGN PATENT DOCUMENTS

| | | |
|---|---|---|
| JP | 8-44622 | 2/1996 |
| WO | WO 2004/059838 A1 | 7/2004 |
| WO | WO 2010/106876 A1 | 9/2010 |

OTHER PUBLICATIONS

S. Yasuda et al., "Semiconductor Integrated Circuit," U.S. Appl. No. 13/232,550, filed Sep. 14, 2011.
Notification of Reasons for Refusal issued by the Japanese Patent Office on May 16, 2014, for Japanese Patent Application No. 2012-052266, and English-language translation thereof.

* cited by examiner

*Primary Examiner* — Don Le
(74) *Attorney, Agent, or Firm* — Finnegan, Henderson, Farabow, Garrett & Dunner, L.L.P.

(57) ABSTRACT

One embodiment provides a look-up table circuit, including: $2^i$ memories, a half of which constituting a first memory group, the other half of which constituting a second memory group; first to i-th input terminals to which first to i-th input signals are input, respectively; a first output terminal; a switch group that selectively connects one of the memories to the first output terminal according to the first to i-th input signals; a first power-off switch that shuts off power supply to the first memory group in response to one of the first to i-th input signals; and a second power-off switch that shuts off power supply to the second memory group in response to the one of the first to i-th input signals.

18 Claims, 23 Drawing Sheets

LOOK-UP TABLE CIRCUIT

CROSS-REFERENCE TO RELATED APPLICATION(S)

This application claims priority/priorities from Japanese Patent Application No. 2012-052286 filed on Mar. 8, 2012, the entire contents of which are incorporated herein by reference.

FIELD

Embodiments described herein relate generally to a look-up table (LUT) circuit.

BACKGROUND

Field programmable gate arrays (FPGAs) are integrated circuits (ICs) capable of realizing arbitrary logic functions. A general FPGA includes plural basic tiles each of which includes logic blocks (LBs) for implementing basic logic information and a switch block (SB) for arbitrarily connecting the LBs to one another. The LB includes one or more LUTs for implementing truth tables. Combinations of circuits, such as a LUT and a register, implement arbitrary logic information. The LUT includes configuration memories (memories) and a multiplexer (MUX). When the LUT is used, one of the memories is selected according to an input signal. Then, data stored in the selected memory is output. The LUT can implement an arbitrary truth table by rewriting data stored in the memory.

Most of conventional FPGAs use a static random access memory (SRAM) as the memory. However, because the SRAM is a voluntary memory, in order to cause the memory to continue to retain data, it is necessary to continue power supply to the SRAM, and thus the power is consumed because of leakage current. Thus, the LUT in which a nonvolatile memory is used is proposed. In the LUT in which the nonvolatile memory is used, when the LUT is not used, the consumed power can be suppressed by shutting off power supply to all the LUT. However the power is supplied to all memory of the LUT at use of the LUT. That is, the power is consumed by the leakage current because the power is also supplied to memory other than memory selected in response to input signals.

DETAILED DESCRIPTION

One embodiment provides a look-up table circuit, including: $2^i$ memories, a half of which constituting a first memory group, the other half of which constituting a second memory group; first to i-th input terminals to which first to i-th input signals are input, respectively; a first output terminal; a switch group that selectively connects one of the memories to the first output terminal according to the first to i-th input signals; a first power-off switch that shuts off power supply to the first memory group in response to one of the first to i-th input signals; and a second power-off switch that shuts off power supply to the second memory group in response to the one of the first to i-th input signals.

First Embodiment

Figure 1:
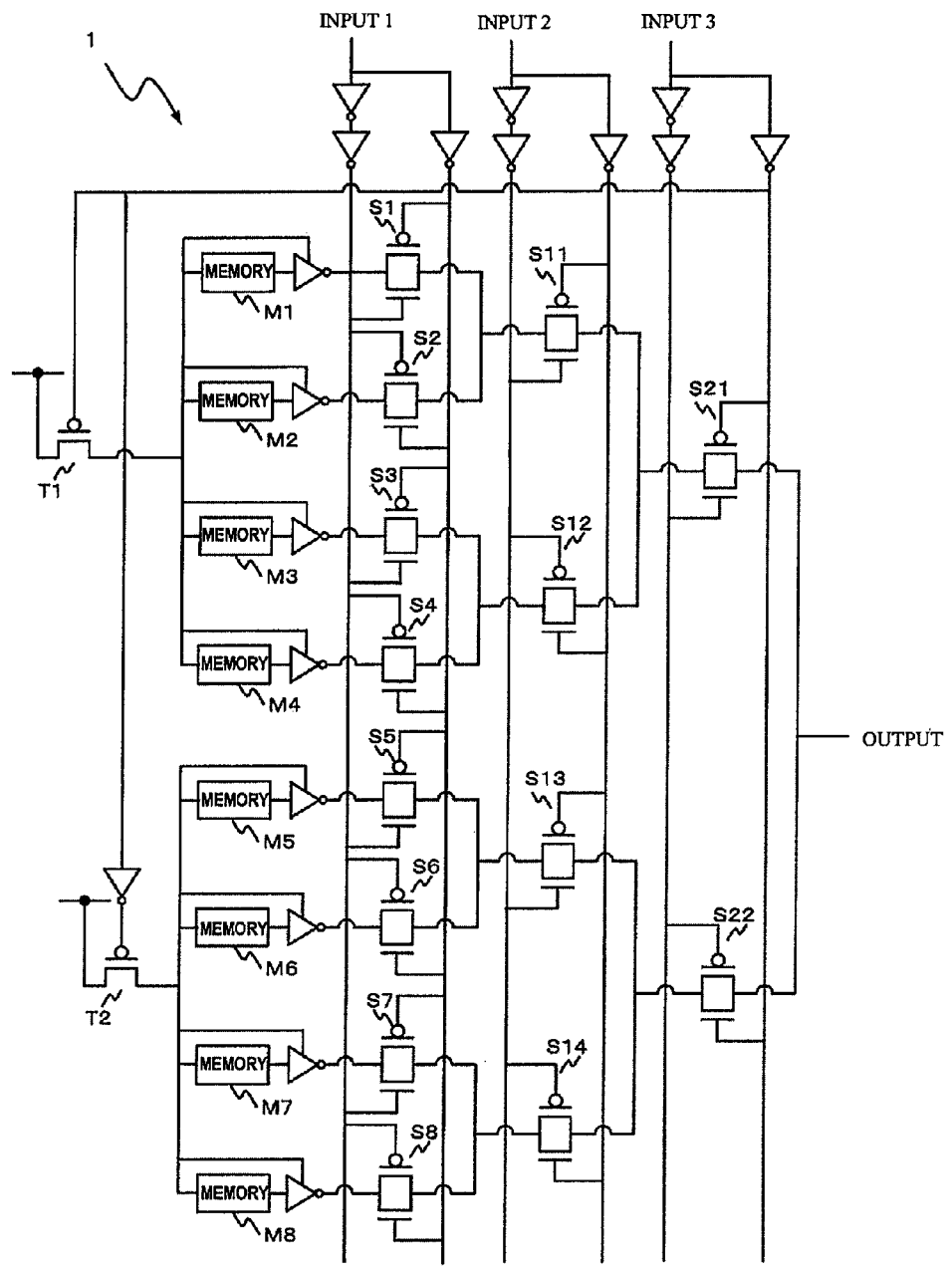
FIG. 1 illustrates a LUT according to a first embodiment.

FIG. 1 illustrates a LUT 1 according to a first embodiment. For example, the LUT 1 is used in a FPGA by being incorporated in each LB thereof.

Although FIG. 1 exemplifies a three-input LUT, it can be generalized as an i-input LUT. In the present embodiment, $2^i$ memories ("i" represents the number of input-ports), that is, eight memories M1 to M8 are provided. The memories M1 to M8 are nonvolatile memories, such as flash memories and resistance random access memories. Each of the memories M1 to M8 is connected to an associated one of switches S1 to S8 via an inverter. The inverters are provided to stabilize outputs of the memories M1 to M8. Each of the switches (first-stage switches) S1 to S8 includes a transfer gate in which a p-type metal oxide semiconductor field effect transistor (MOSFET) and an n-type MOSFET are combined.

When a first input signal INPUT1 is input to each of the first-stage switches S1 to S8, half of the switches S1 to S8 are turned on, while the remaining half thereof are turned off. For example, it is assumed that a voltage level "High" corresponding to the power-supply voltage level represents a logic "1", and that a voltage level "Low" represents a logic "0". In this case, if the signal INPUT1 represents "1", the switches S1, S3, S5 and S7 are turned on, while the switches S2, S4, S6 and S8 are turned off. If the signal INPUT1 represents "0", the switches S1, S3, S5 and S7 are turned off, while the switches S2, S4, S6 and S8 are turned on. The switches S1 to S8 are paired two by two, and outputs of the four pairs are connected to switches (second-stage switches) S11 to S14, respectively.

When a second input signal INPUT2 is input to each of the second-stage switches S11 to S14, half of the switches S11 to S14 are turned on, while the remaining half thereof are turned off. The switches S11 to S14 are pared two by two similarly to the switches S1 to S8, and outputs of the two pairs are connected to switches (third-stage switches) S21 and S22, respectively. And, when a third input signal INPUT3 is input to each of the third-stage switches S21 and S22, one of the switches S21 and S22 is turned on, while the other thereof is turned off. Thus, information stored in the intended memory can be output from an output terminal of the LUT 1, by turning on a part of the switches S1 to S22 which are disposed between the intended memory and the output terminal.

The LUT 1 further includes switch transistors T1 and T2. The sources of the switch transistors T1 and T2 are connected to the power-supply voltage. The drain of the switch transistor T1 is connected to the memories M1 to M4, while the drain of the switch transistor T2 is connected to the memories M5 to M8. And, the input signal INPUT3 is input to the gate of the switch transistor T1, while the inversion signal of the input signal INPUT3 is input to the gate of the switch transistor T2. Thus, in response to the input signal INPUT3, since one of the switch transistors T1 and T2 is turned on while the other thereof is turned off, the power supply to one of a set of the memories M1 to M4 and a set of the memories M5 to M8 is shut off. In addition, the power supply to the inverters provided to stabilize the outputs of these memories is also interrupted. In the LUT 1, for example, if the input signal INPUT3 represents "1", the switch S21 is turned on while the switch S22 is turned off, and the switch transistor T1 is turned on while the switch transistor T2 is turned off. Accordingly, the power supply to the memories M5 to M8 connected to the switch S22 is shut off (the power supply to the memories which are not intended to be selected is shut of). Thus, by providing a switch between memories and an output terminal of a LUT such that the switch is turned off based on an input signal to the LUT, the power supply to the memory which does not affect the operation of the LUT can be shut off, and leakage current can be reduced.

Figure 2:
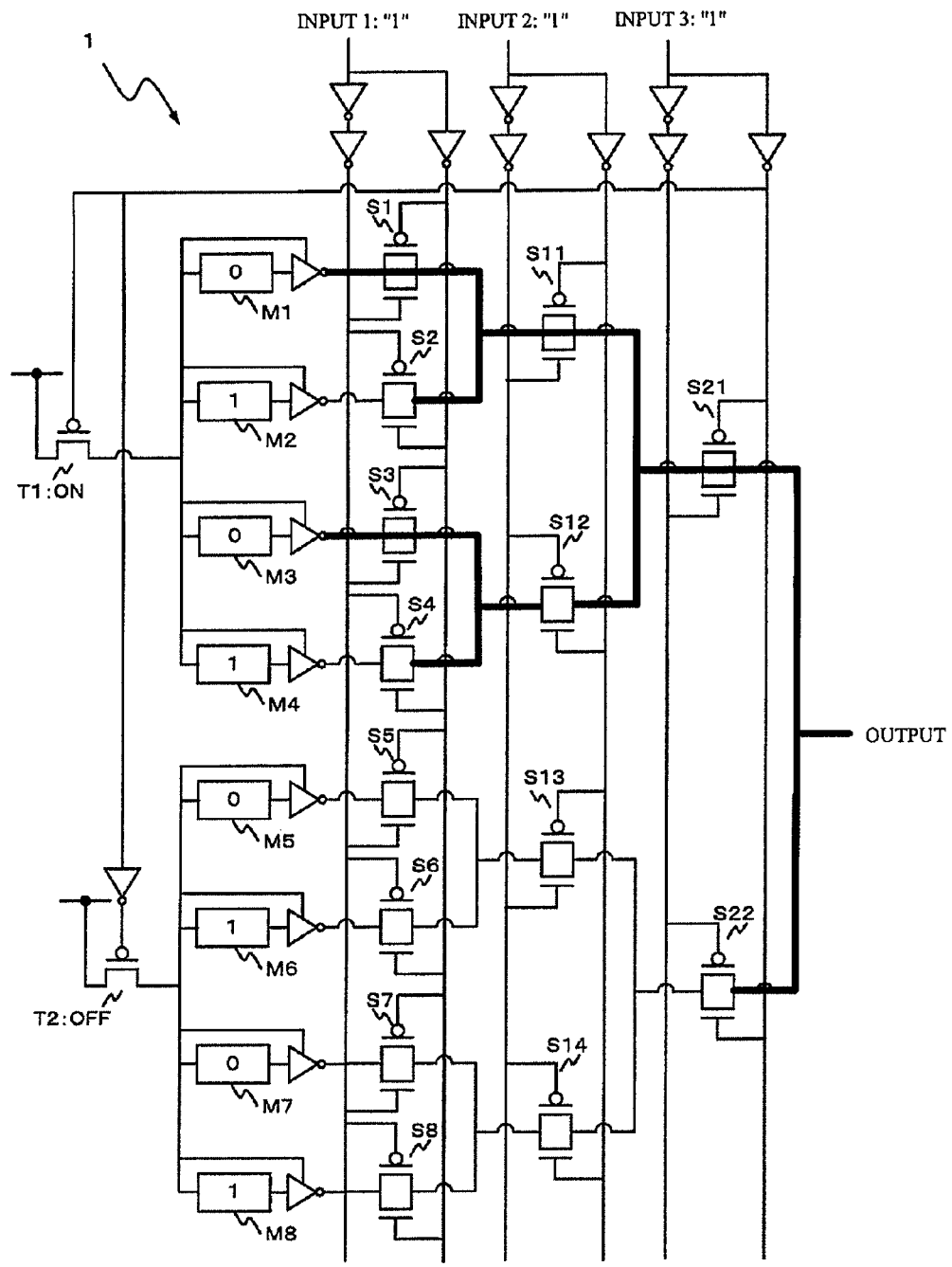
FIGS. 2 and 3 illustrate operation of the LUT.

FIG. 2 exemplifies a most electrified state of the LUT 1 in which all of the input signals INPUT1 to INPUT3 represent "1" and the memories M1 to M8 store "0", "1", "0", "1", "0", "1", "0" and "1", respectively. In this state, the interconnection lines indicated with thick lines are electrified to the voltage level "High" to transfer a signal representing "1". As illustrated in FIG. 2, components between the switch S22 which is turned off according to the input signal INPUT3 and the memories M5 to M8 are not electrified.

Figure 3:
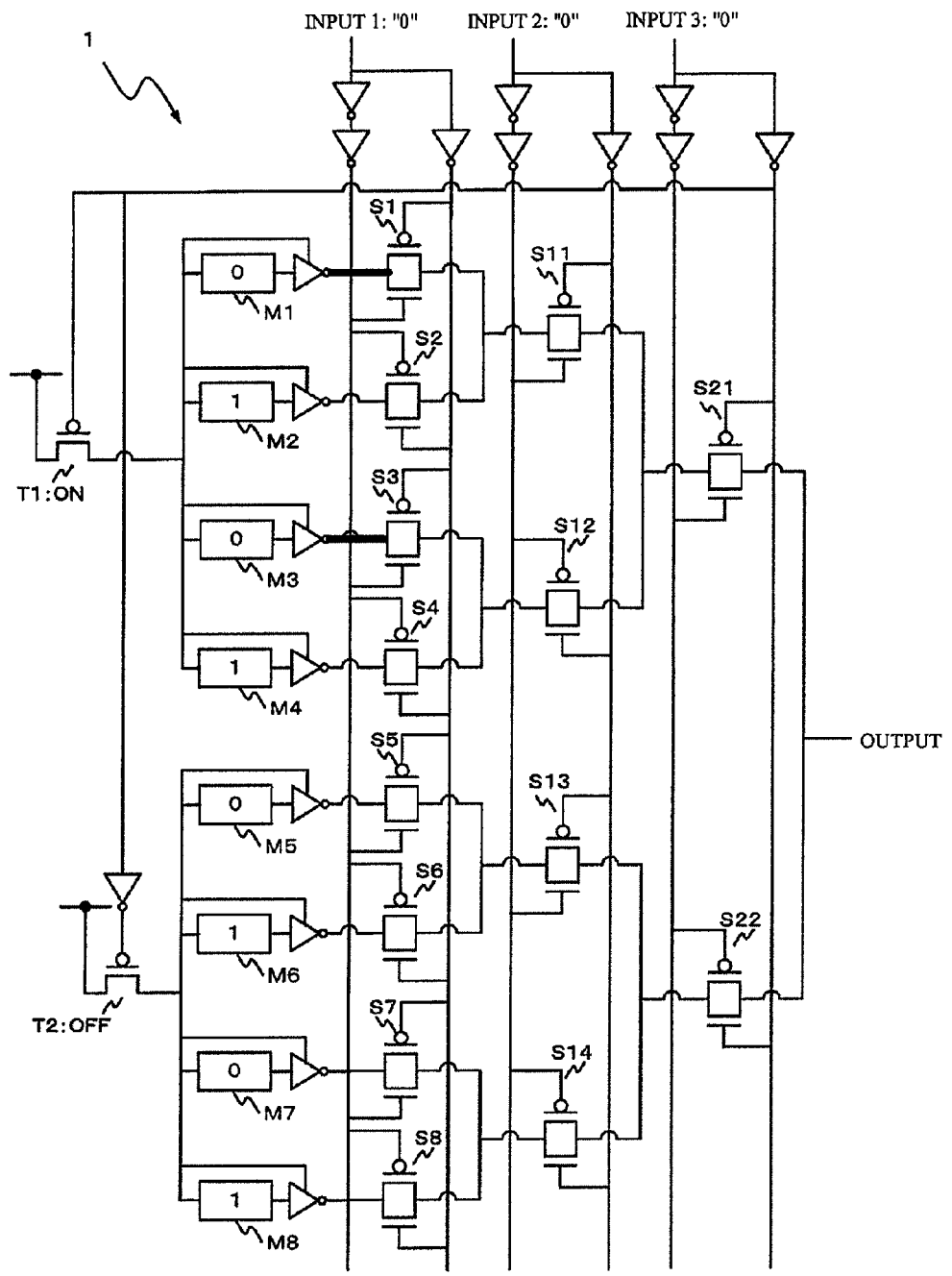

On the other hand, FIG. 3 exemplifies a least electrified state of the LUT 1. In this state, only the interconnection lines indicated with thick lines are electrified to the voltage level "High". Hereinafter, a situation where the LUT 1 is changed from the least electrified state of FIG. 3 to the most electrified state of FIG. 2 is considered for evaluation. Specifically, the delay, the power and the area of the LUT 1 are evaluated by the simulation.

Figure 4:
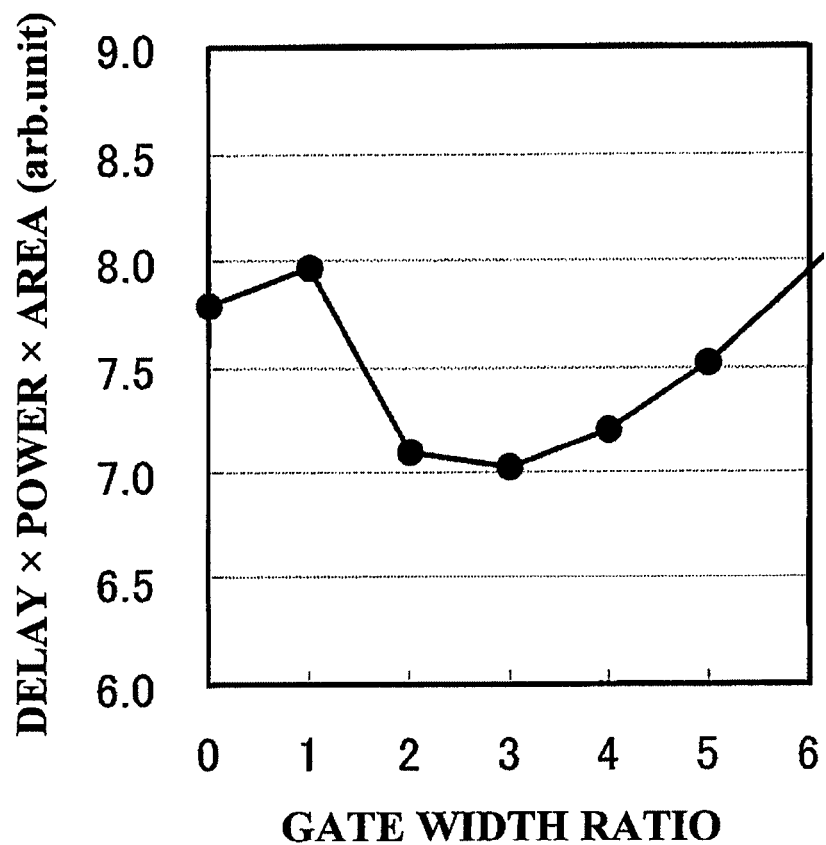
FIG. 4 illustrates simulation result concerning the LUT.

In FIG. 4, the abscissa axis represents a ratio of the gate width of the switch transistors T1 and T2 to the gate width of the transistors in the switches S1 to S22, and the ordinate axis represents an evaluation value corresponding to the product of the delay, the power and the area. The case of a gate width ratio of 0 is that the switch transistors T1 and T2 are not provided. As the gate width of the switch transistors T1 and T2 increases, a signal delay decreases since an amount of current supplied from the power supply through the switch transistors T1 and T2 increases, but on the other hand, the area of the LUT increases. According to FIG. 4, a moderate gate width ratio of the switch transistors T1 and T2 to the transistors in the switches S1 to S22 is about three. On the other hand, even when the gate width ratio is about five, it is also effective, as compared with the case where the switch transistors T1 and T2 are not provided. The simulation result illustrated in FIG. 4 is just an example, and another kind of evaluation value may be used to evaluate the effect realized by providing the switch transistors T1 and T2.

On the other hand, by setting the gate width of the switch transistors T1 and T2 to be small, the dynamic power consumption can be reduced. For example, in the state of FIG. 2, components anterior and posterior to the switch turned off (components which are not necessary to be electrified) are also electrified. If the gate width of the switch transistors T1 and T2 is small, an amount of current supplied from the power supply through the switch transistors T1 and T2 is small. Thus, in a situation where input signals are changed and one of the switch transistors T1 and T2 is turned off from the turned-on state, the components anterior and posterior to the switch to be turned off (the components which are not necessary to be electrified) may be prevented from being fully electrified through the switch transistor until it is completely turned off, and thus, the dynamic power consumption may be consequently suppressed.

Various modifications described hereinafter can be made to the LUT according to the present embodiment. Alternatively, a combination of plural modifications can be applied to the LUT according to the present embodiment.

(First Modification)

Figure 5:
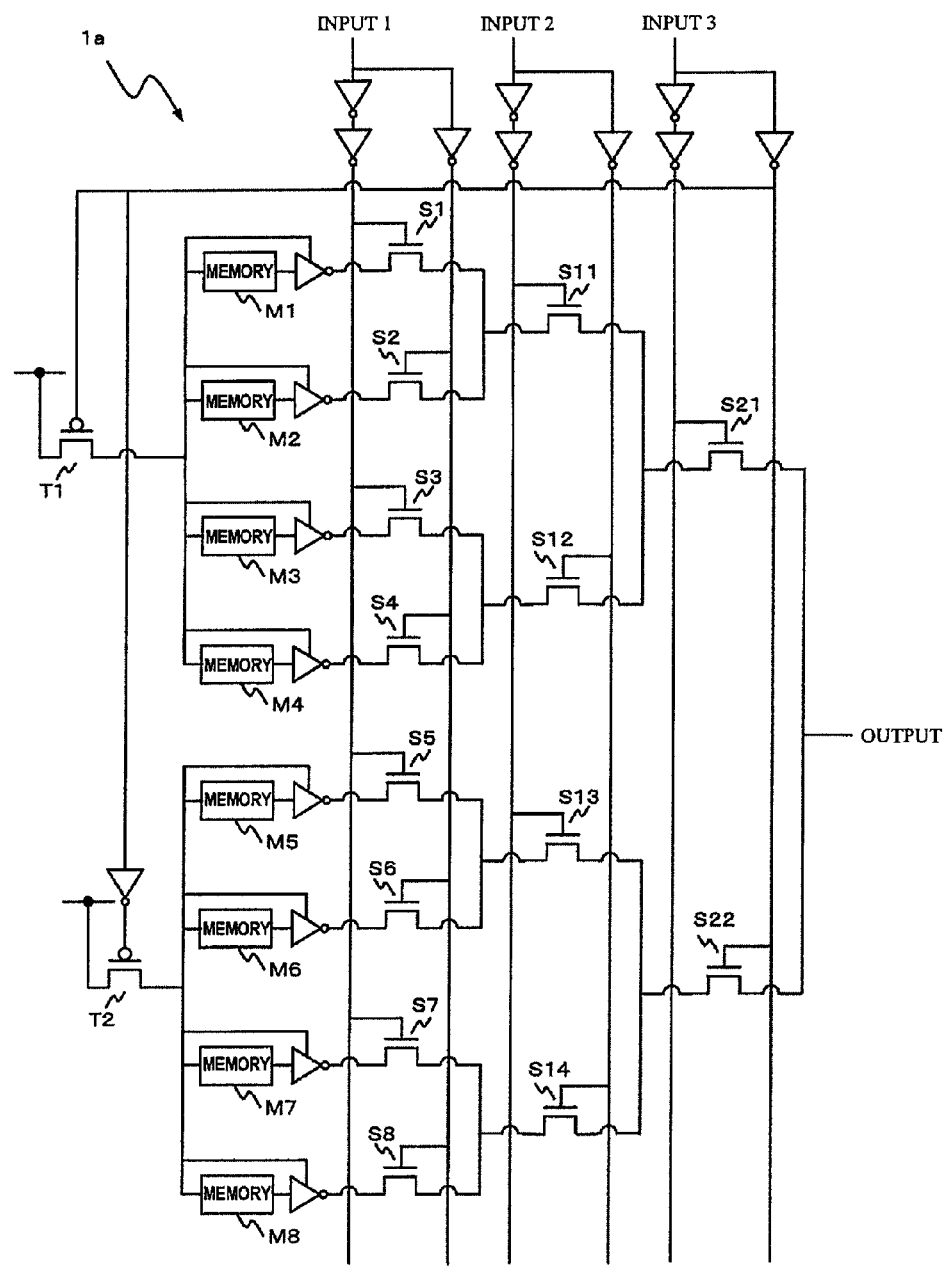
FIG. 5 illustrates a first modification of the first embodiment.

As a LUT 1a of FIG. 5, each of the switches S1 to S22 may be an n-type MOSFET. Alternatively, a part of the switches S1 to S22 may be realized by transfer gates, while the remaining switches may be realized by n-type MOSFETs. As long as the information stored in the intended memory can be selectively output to the output signal of the LUT according to the input signals, any structure may be adapted for the switches S1 to S22.

(Second Modification)

Figure 6:
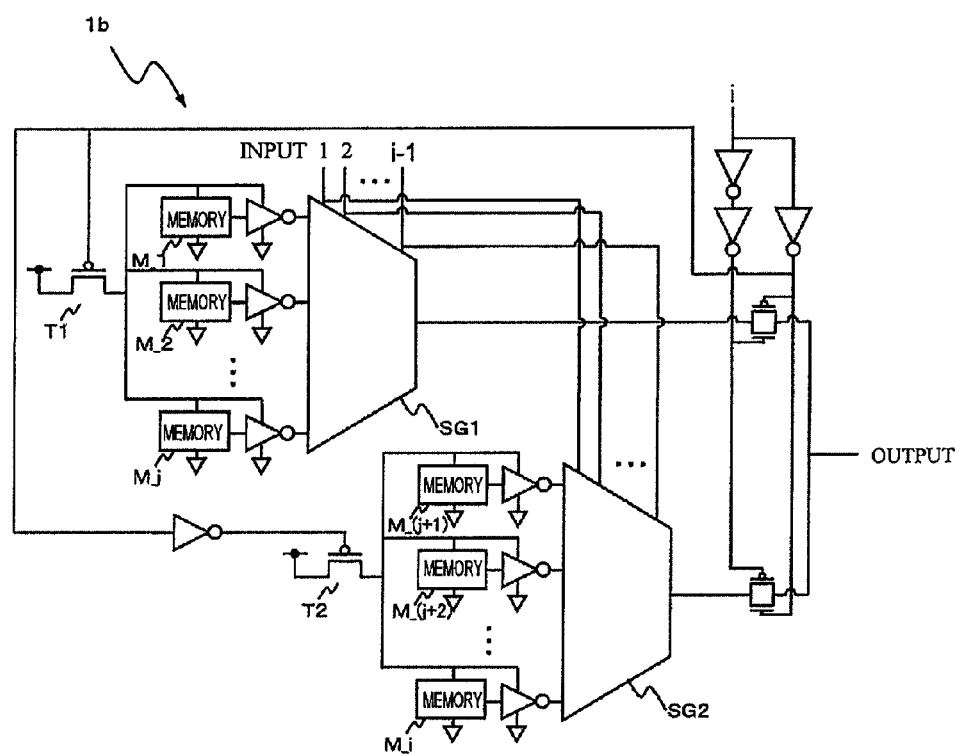
FIG. 6 illustrates a second modification of the first embodiment.

As illustrated in FIG. 6, the present embodiment is not limited to the three-input LUT, but can be applied to an i-input LUT 1b. The number of input-ports may be an arbitrary number that is equal to or more than 2. As described in the first modification, any structure may be adapted for the switch. Thus, in FIG. 6, switch groups SG1 and SG2 are represented by multiplexers. A circuit including the switch group SG1 and memories M_1 to M_j can be regarded as a first LUT, and a circuit including the switch group SG2 and memories M_(j+1) to M_i can be regarded as a second LUT. Thus, the LUT 1b can also be regarded as a circuit that includes the first LUT and the second LUT and a switch for selecting one of them.

(Third Modification)

Figure 7:
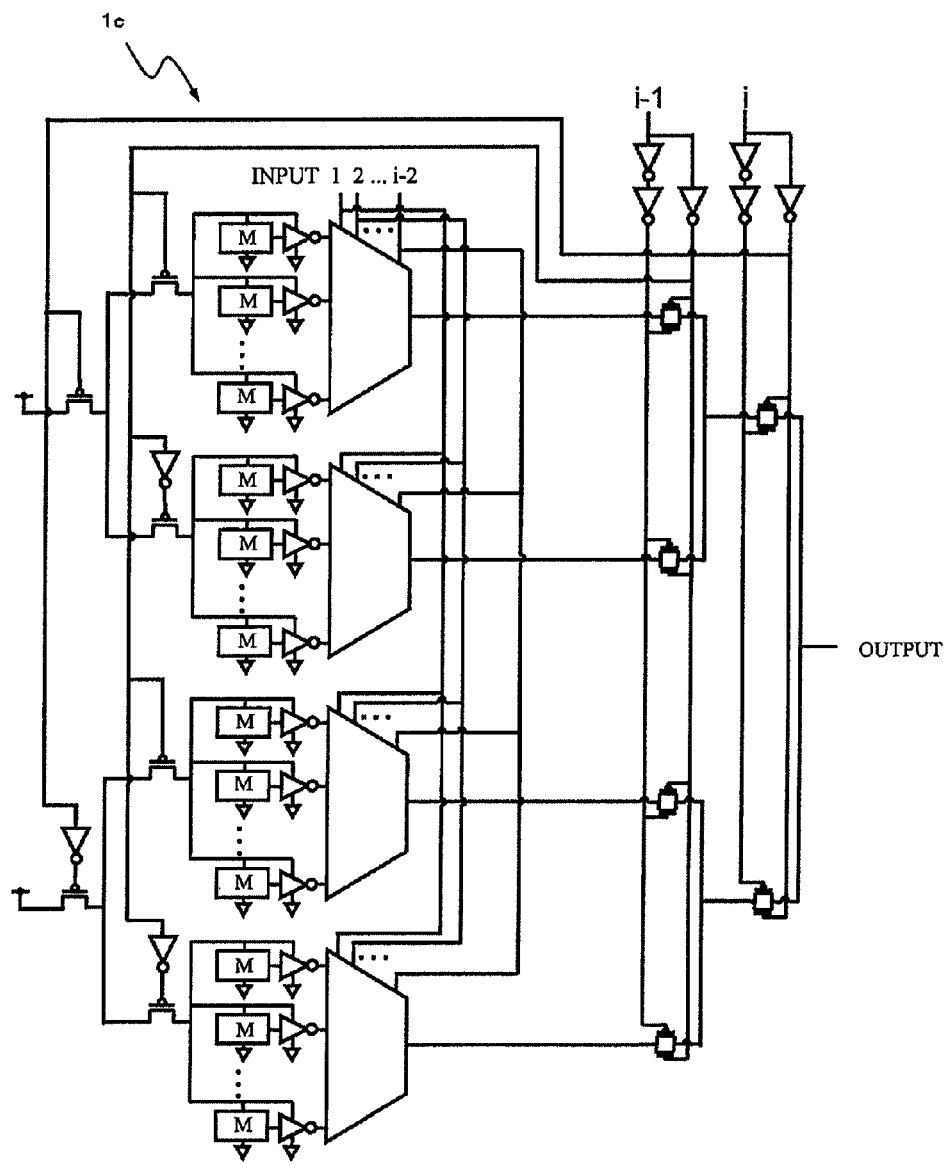
FIGS. 7 to 9 illustrate a third modification of the first embodiment.

As a LUT 1c of FIG. 7, the power supply to the memories may be controlled based on plural input signals. In this case, although the circuit area increases, the power supply to a larger number of memories can be shut off, as compared with the case of controlling the power supply to the memories based on one input signal. Consequently, power consumption can be further reduced. Although FIG. 7 illustrates a structure in which the power supply to the memory is controlled based on two input signals, it may be controlled based on three or more input signals.

Figure 8:
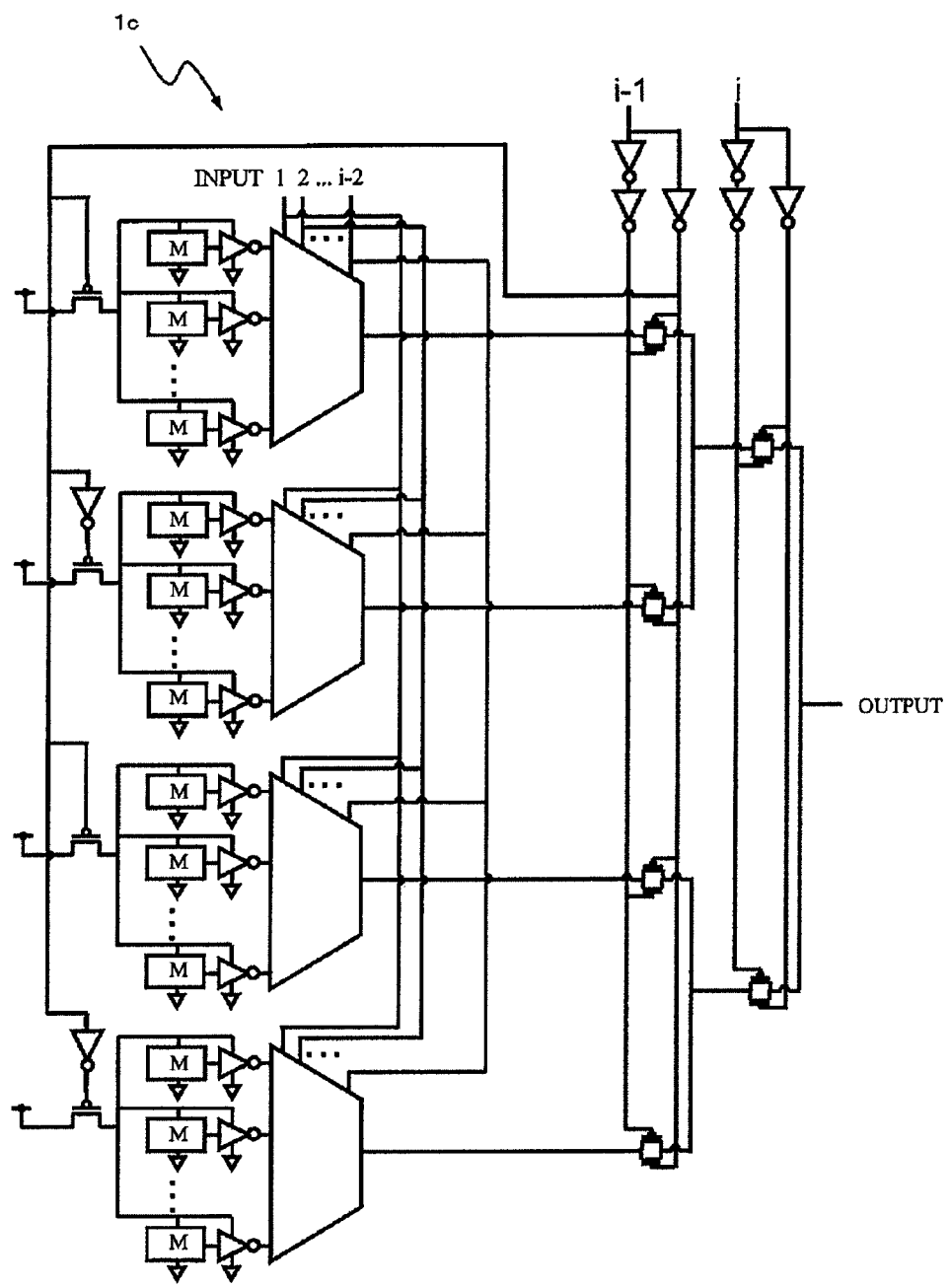
Figure 9:
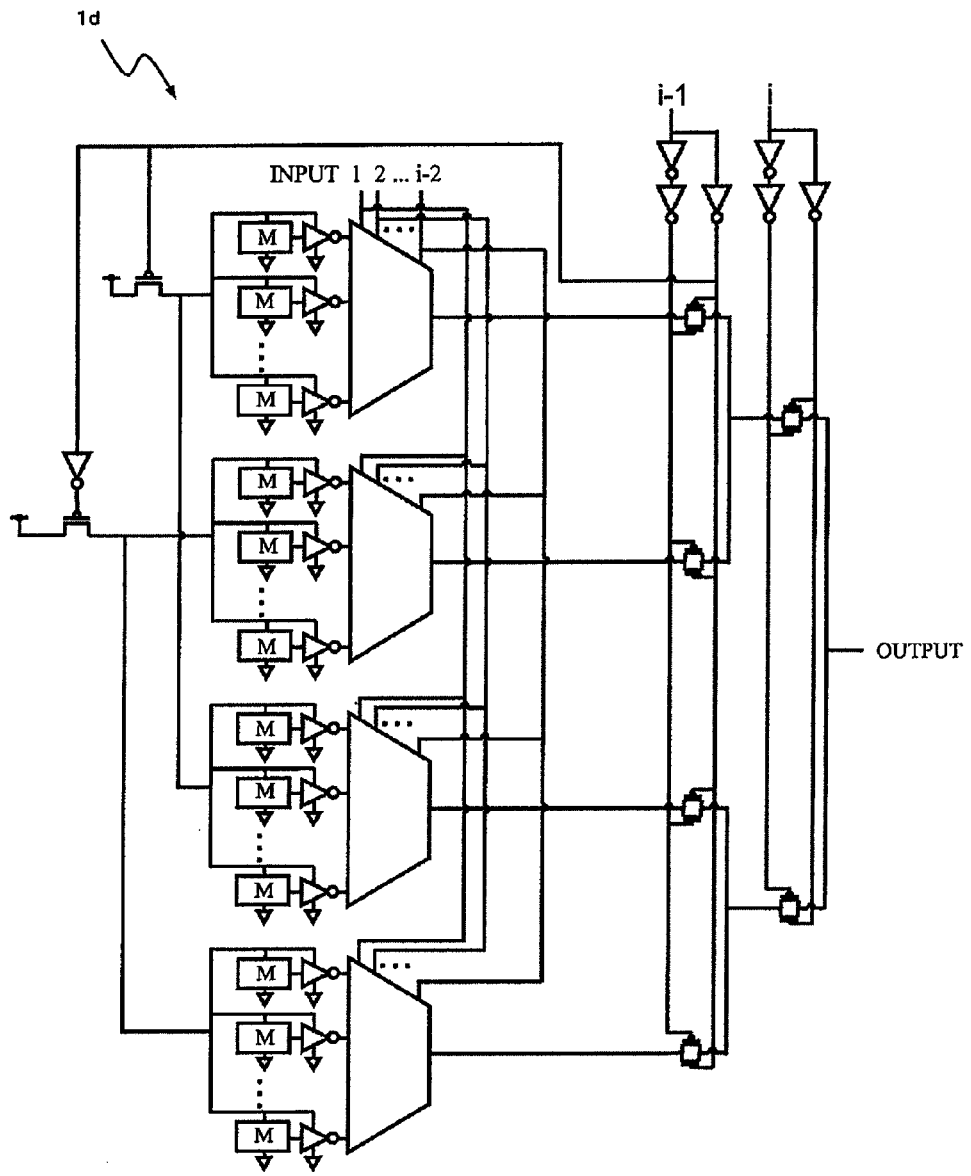

Any of the input signals may be used to control the power supply to the memories. For example, in a LUT 1c of FIG. 8, the power supply to the memories is controlled based on an (i−1)-th input signal. Although the LUT 1c illustrated in FIG. 8 uses four switch transistors, only two switch transistors may be used as a LUT 1d of FIG. 9.

Figure 10:
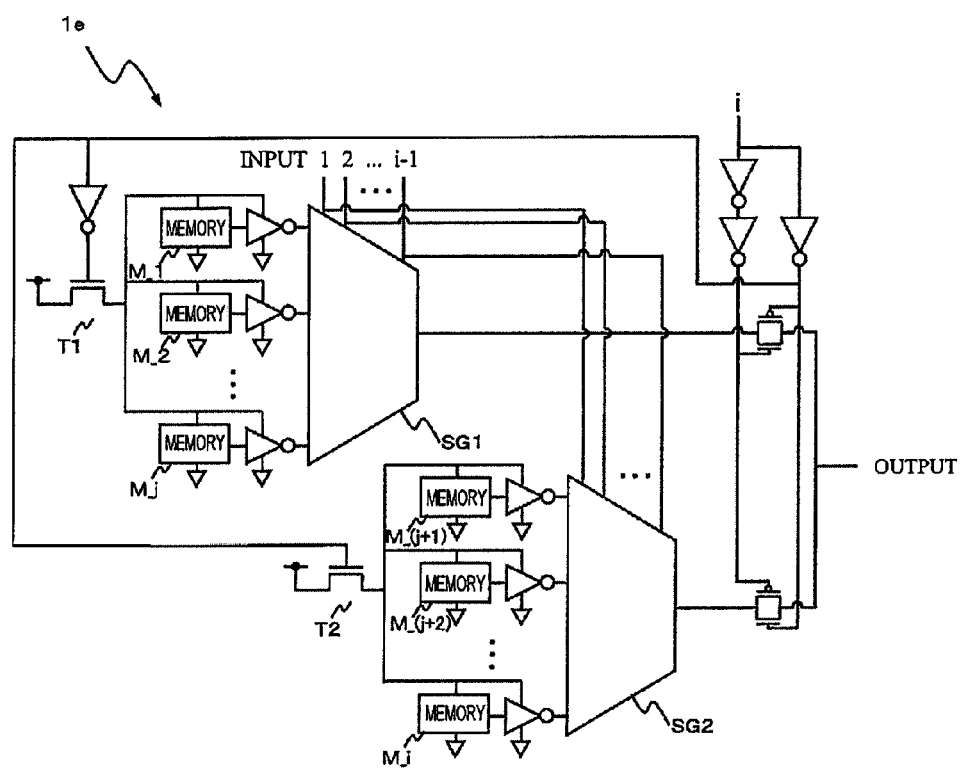
FIG. 10 illustrates a fourth modification of the first embodiment.
Figure 11:
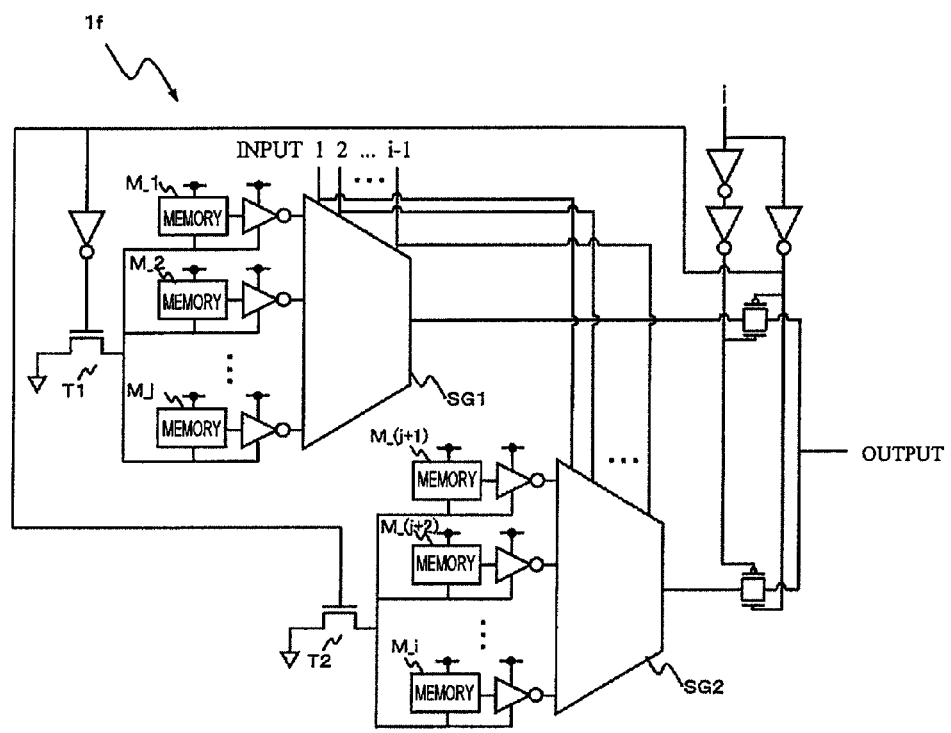
FIG. 11 illustrates a fifth modification of the first embodiment.
Figure 12:
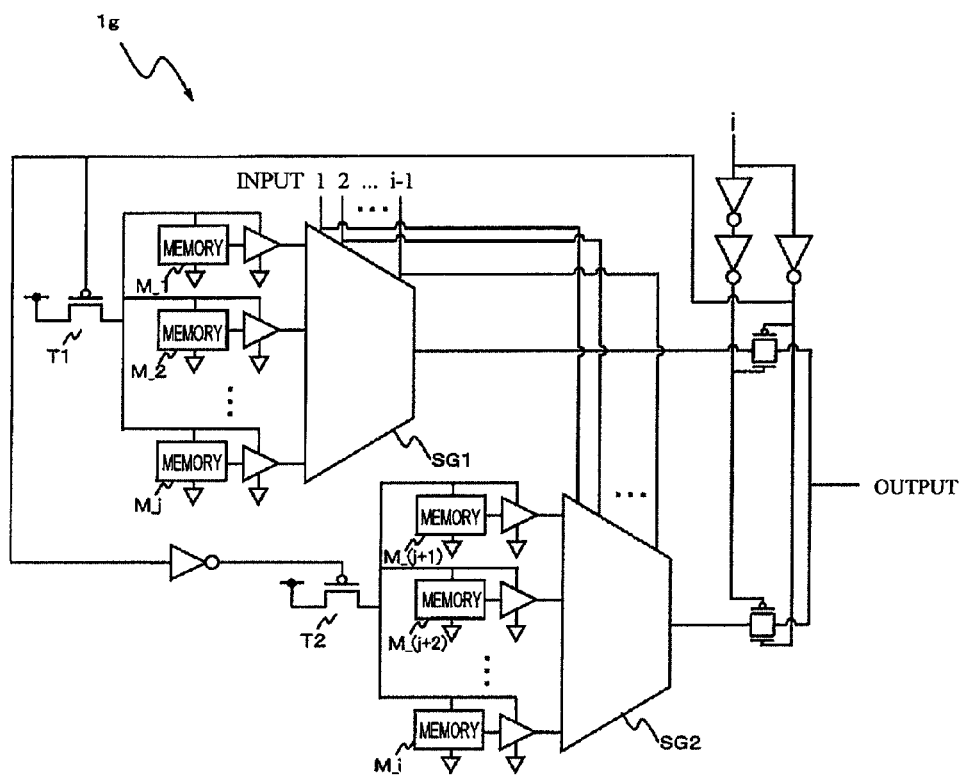
FIGS. 12 and 13 illustrate a sixth modification of the first embodiment.
Figure 13:
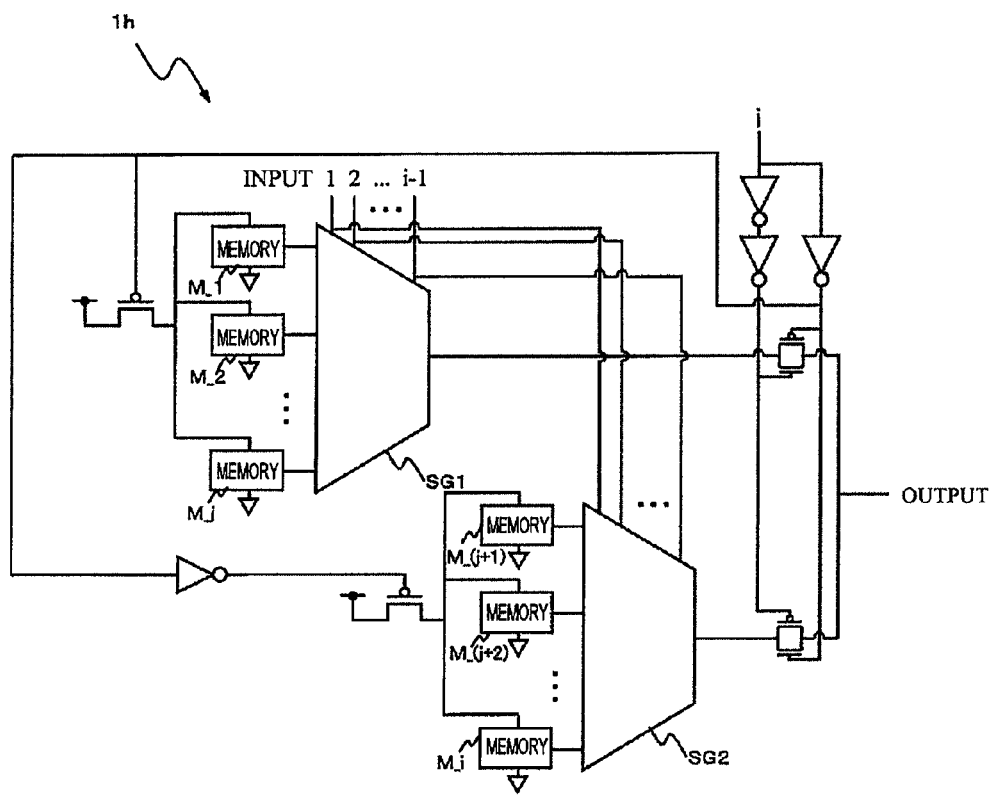
Figure 14:
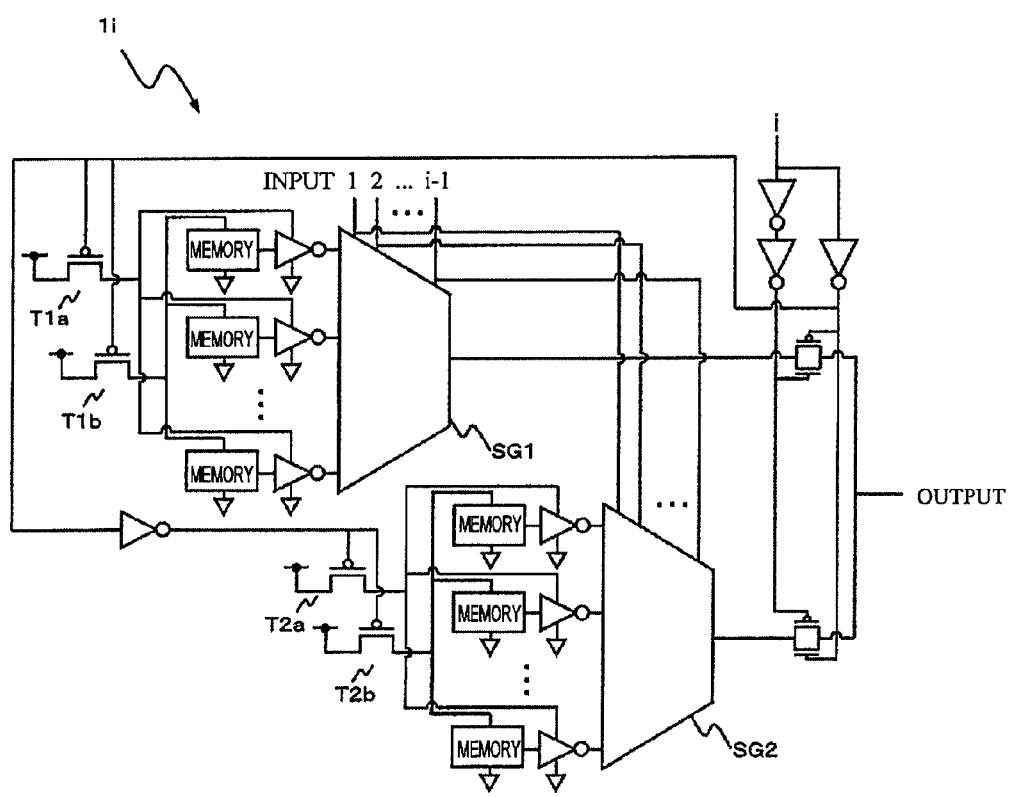
FIG. 14 illustrates a seventh modification of the first embodiment.
Figure 15:
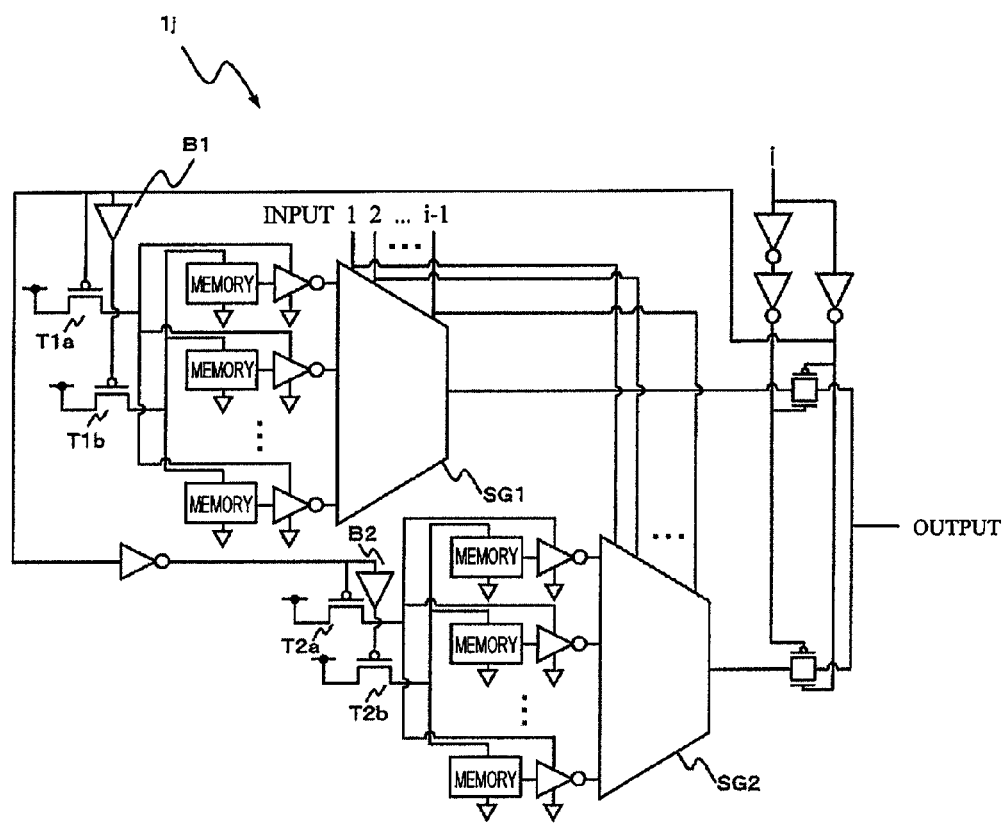
FIGS. 15 and 16 illustrate an eighth modification of the first embodiment.
Figure 16:
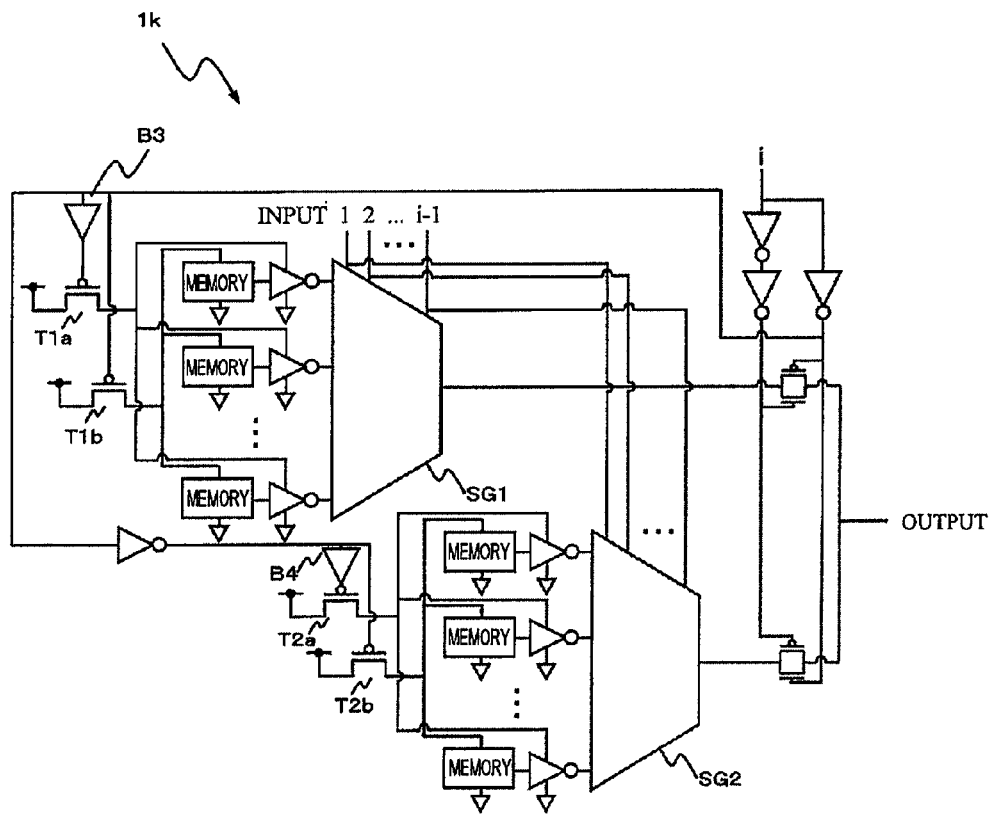

Although any above-mentioned structure can be theoretically adapted, practically, the input signal applied to the input port closer to the output terminal may be preferentially used to control the switch transistors. Usually, an input wire closer to the output terminal is connected with the smaller number of the switches. That is, an input wire closest to the output terminal is merely required to drive the smallest number of switches. Thus, by controlling the power supply to the memories using the input signal supplied to the switch closest to the output terminal, the operation speed of the LUT 1c can be made high. Accordingly, even if the switch transistors are added, the operation speed of the LUT 1c is little affected.
(Fourth Modification)
As a LUT 1e of FIG. 10, the switch transistors T1 and T2 used to control the power supply to the memories may be n-type MOSFETs.
(Fifth Modification)
The shut off of the power supply to the memories may be performed not at the power supply side but at the ground side. That is, as a LUT 1f of FIG. 11, the switch transistor may be provided between each memory and the ground. Alternatively, the switch transistors may be provided at both the power supply side and the ground side. That is, the switch transistor may be provided not only between the power supply and each memory but between each memory and the ground. Consequently, both of the static power consumption and the dynamic power consumption can be reduced.
(Sixth Modification)
Plural inverters may be connected to the memories to stabilize the outputs of the memories. For example, as a LUT 1g of FIG. 12, buffers (i.e., an even number of inverters) may be provided. On the other hand, if the memory has sufficient drive power, the inverters or buffers may be omitted, as a LUT 1h of FIG. 13.
(Seventh Modification)
As a LUT 1i of FIG. 14, the power supply to the memories and the power supply to the inverters or buffers may be separately controlled using the different switch transistors. For example, if the power-supply voltage for the memories differs from that for the inverters or buffers, switch transistors T1a and T2a for controlling the power supply to the inverters or buffers and switch transistors T1b and T2b for the power supply to the memories may be provided.
(Eighth Modification)
As a LUT 1j of FIG. 15, if the power-supply voltage for the memories largely differs from an operating voltage for the LUT 1j, buffers B1 and B2 may be connected to the gates of the switch transistors T1b and T2b for controlling the power supply to the memories. Alternatively, as a LUT 1k of FIG. 16, buffers B3 and B4 may be connected to the gates of the switch transistors T1a and T2a for stabilizing the outputs of the memories. Consequently, the voltage of each memory can be adjusted by changing the power-supply voltage for the inverters or buffers.

Second Embodiment

Figure 17:
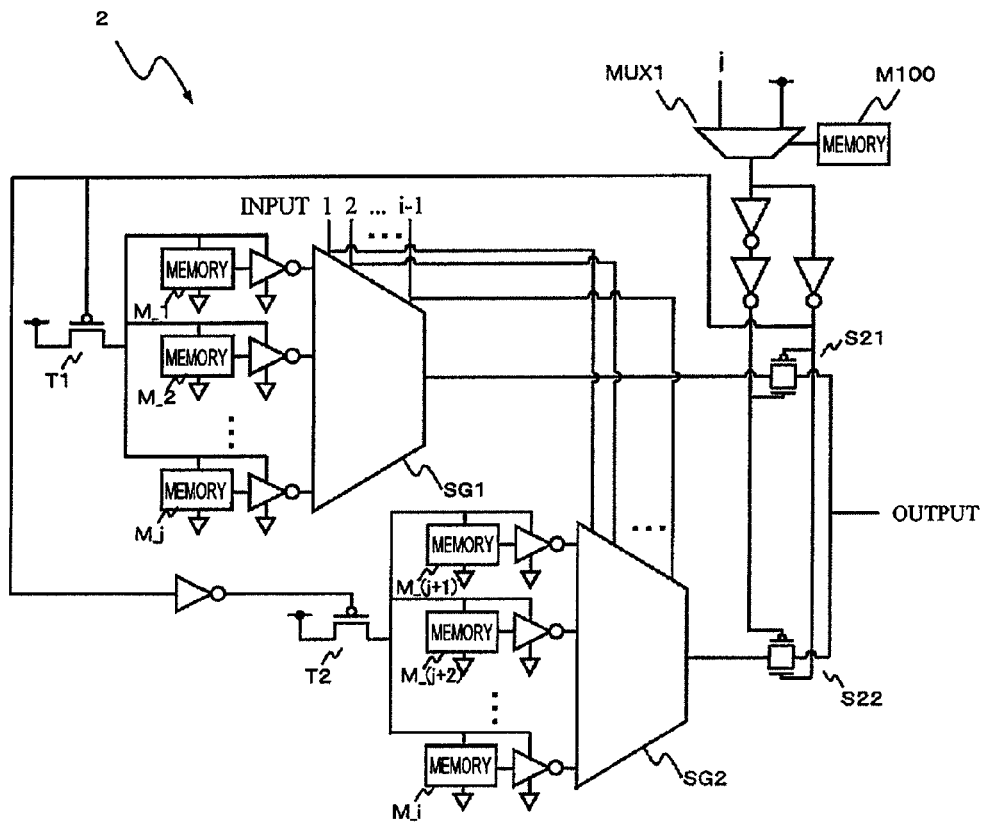
FIG. 17 illustrates a LUT according to a second embodiment.
Figure 18:
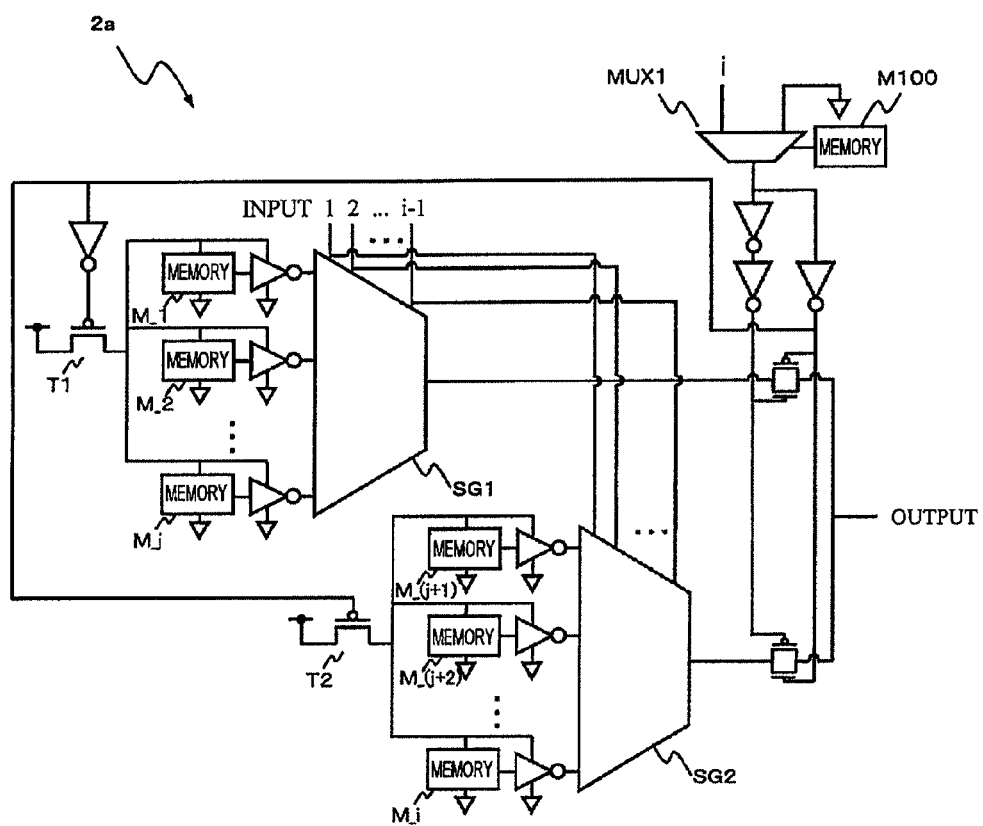
FIG. 18 illustrates a modification of the second embodiment.

FIG. 17 illustrates a LUT 2 according to a second embodiment. The LUT 2 is an i-input LUT. The LUT 2 further includes a multiplexer MUX1 on an input wire closest to an output terminal. The multiplexer MUX1 selects one of an i-th input signal and a fixed voltage according to information stored in a memory M100. Although the fixed voltage may be either the power-supply voltage or the ground voltage, FIG. 17 exemplifies a case where the power-supply voltage is used as the fixed voltage. The LUT 2 can be used as either an i-input LUT or an (i−1)-input LUT.
The memory M100 stores information indicating whether the LUT 2 is used as an i-input LUT or as an (i−1)-input LUT. If the information stored in the memory M100 indicates that the LUT 2 is used as an i-input LUT, the multiplexer MUX1 selects an i-th input signal. When the multiplexer MUX1 selects the i-th input signal, the LUT 2 operates similarly to the LUT 1 according to the first embodiment, and therefore, the description of such operation of the LUT 2 is omitted.
If the information stored in the memory M100 indicates that the LUT 2 is used as an (i−1)-input LUT, the multiplexer MUX1 selects the power-supply voltage. Then, signal representing "0" is input to the switch transistor T1, while a signal representing "1" is input to the switch transistor T2. Thus, the switch transistor T1 is turned on, while the switch transistor T2 are turned off.
In this state, regardless of how the i-th input signal changes, the power supply to half of the LUT 2 (i.e., a circuit including the memories M_(j+1) to M_i) is kept interrupted. Accordingly, the i-input LUT 2 can be used as an (i−1)-input LUT, while reducing the power consumption. Here, the same information may be written to both of a memory group M_1 to M_j connected to the switch transistor T1 and a memory group M_(j+1) to M_i connected to the switch transistor T2. Although it is not necessary to write the information to the memory group M_(j+1) to M_i connected to the switch transistor T2 which is to be turned off, by writing the same information thereto, the LUT 2 can be prevented from being affected by the fluctuation in the fixed voltage during the operation as the (i−1)-input LUT.
Generally, in a FPGA, each of logic blocks includes a LUT having a predetermined number of input-ports. That is, generally, all the LUTs in the FPGA have the same number of input-ports. However, according to a logic synthesis, a placement and routing and the like, all the LUTs are not necessarily used as the predetermined-number-input LUTs. For example, an experiment of performing a logic synthesis and a placement and routing for twenty types of benchmark circuits was conducted using a FPGA including four-input LUTs. As a result, about 20% of the four-input LUTs were used as three-input LUT, and a sum-total of the LUTs used as the four-input LUTs and those used as the three-input LUTs are about 90% of all the LUTs in the FPGA. That is, most of the i-input LUTs are used as i-input LUTs or (i−1)-input LUTs. By adding the multiplexer MUX1 and the memory M100 to the LUT according to the first embodiment, the power consumption may be reduced, but on the other hand, the circuit area increases. Therefore, although the LUT 2 can be used also as, e.g., an (i−2)-input LUT by further adding a multiplexer and a memory, it may be preferable that only one multiplexer and one memory are added thereto in view of the above-mentioned experimental result indicating the LUTs are mostly used as the i-input LUTs or (i−1)-input LUTs.
The modifications described in the first embodiment can be made to the LUT 2 according to the second embodiment. Alternatively, a combination of plural modifications can be applied to the LUT 2. In addition, the following modification can be made to the LUT 2.
(Modification)
FIG. 18 illustrates a LUT 2a in which the ground voltage is used as the fixed voltage. In this case, the multiplexer MUX1 selects one of an i-th input signal and the ground voltage. In the LUT 2 of FIG. 17, an inverter is connected to the gate of the switch transistor T2. On the other hand, in the LUT 2a of FIG. 18, an inverter is connected to the gate of the switch transistor T1. Consequently, if the multiplexer MUX1 selects the ground voltage, a signal representing "0" is input to the gate of the switch transistor T1 such that the switch transistor T1 is turned on. And, a signal representing "1" is input to the gate of the switch transistor T2 such that the switch transistor T2 is turned off. That is, the LUT 2a operates similarly to the LUT 2.

Third Embodiment

Figure 19:
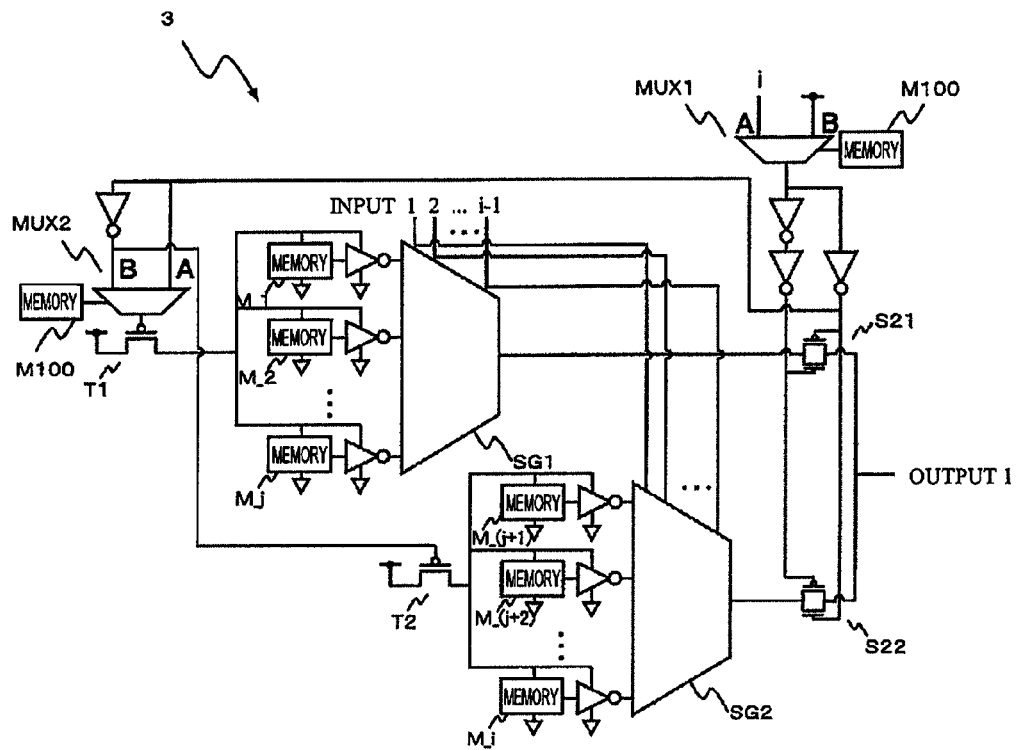
FIG. 19 illustrates a LUT according to a third embodiment.

FIG. 19 illustrates a LUT 3 according to a third embodiment. The LUT 3 is an i-input LUT. The LUT 3 includes a multiplexer MUX1 on an input wire closest to an output terminal. The multiplexer MUX1 selects one of an i-th input signal and a fixed voltage according to information stored in a memory M100. The LUT 3 further includes a multiplexer MUX2 which is connected to the gate of the switch transistor T1. The multiplexer MUX2 selects one of two signals described below according to the information stored in the memory M100. The memory M100 connected to the multiplexer MUX1 and MUX2 may be either a single memory or different memories which store the same information. If the multiplexer MUX1 selects a signal input to an input terminal A thereof, the multiplexer MUX2 also selects a signal input to an input terminal A thereof. And, if the multiplexer MUX1 selects a signal input to an input terminal B thereof, the multiplexer MUX2 also selects a signal input to an input terminal B thereof. Although the fixed voltage may be either the power-supply voltage or the ground voltage, FIG. 19 exemplifies a case where the power-supply voltage is used as the fixed voltage. The LUT 3 can shut off the power supply to all the memories connected to the switch transistors T1 and T2.

The memory M100 stores information indicating whether the LUT 3 is used or not. If the information stored in the memory M100 indicates that the LUT 3 is used, the multiplexer MUX1 selects the i-th input signal. At that time, the multiplexer MUX2 selects an inversion signal of the i-th input signal. For example, if the i-th input signal represents "0", a signal representing "1" is input to the gate of the switch transistor T1 such that the switch transistor T1 is turned off. And, a signal representing "0" is input to the gate of the switch transistor T2 such that the switch transistor T2 is turned on. Concurrently, the switch S21 is turned off, while the switch S22 is turned on. Thus, the LUT 3 operates similarly to the LUT 1 according to the first embodiment. That is, if the switch provided between the output terminal and each memory is turned off based on the input signal, the power supply to the memory is shut off based on the input signal, thereby reducing the power consumption.

If the information stored in the memory M100 indicates that the LUT 3 is not used, the multiplexer MUX 1 selects the power-supply voltage input to the input terminal B. At that time, the multiplexer MUX2 selects a signal input to the input terminal B, that is, the power-supply voltage. Consequently, a signal representing the voltage level "High" is input to both of the switch transistors T1 and T2 such that both of the switch transistors T1 and T2 are turned off. Thus, the power supply to all the memories $M\_1$ to $M\_i$ can be interrupted.

Modification described in each of the first and second embodiments can be made to the LUT 3 according to the third embodiment. Alternatively, a combination of plural modifications can be applied to the LUT 3. Further alternatively, the second embodiment can be combined with the third embodiment.

Fourth Embodiment

Figure 20:
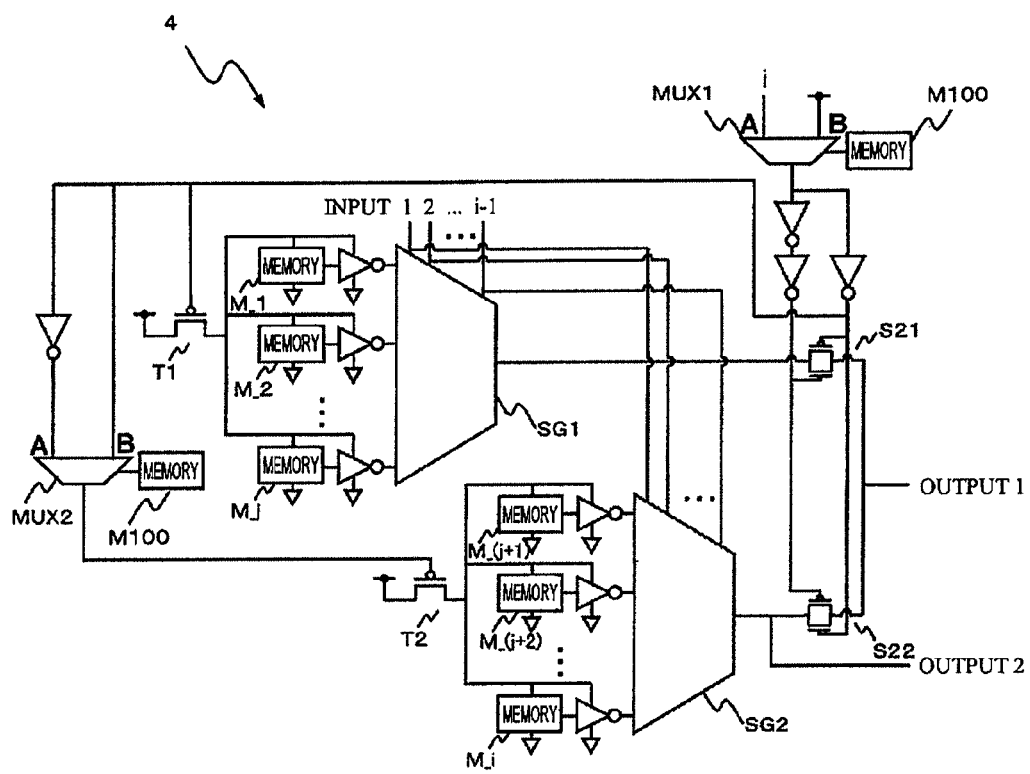
FIG. 20 illustrates a LUT according to a fourth embodiment.

FIG. 20 illustrates a LUT 4 according to a fourth embodiment. The LUT 4 is an i-input LUT. The LUT 4 includes a multiplexer MUX1 provided on an input wire closest to an output terminal. The multiplexer MUX 1 selects one of an i-th input signal and a fixed voltage according to information stored in the memory M100. And, the LUT 4 further includes a multiplexer MUX2 connected to the gate of the switch transistor T2. The multiplexer MUX2 selects one of the two signals described below according to the information stored in the memory M100. The memory M100 connected to the multiplexers MUX1 and MUX2 may be either a single memory or different memories that store the same information. If the multiplexer MUX1 selects a signal input to an input terminal A thereof, the multiplexer MUX2 also selects a signal input to an input terminal A thereof. And, if the multiplexer MUX1 selects a signal input to an input terminal B thereof, the multiplexer MUX2 also selects a signal input to an input terminal B thereof. Although the fixed voltage may be either the power-supply voltage or the ground voltage, FIG. 20 exemplifies a case where the power-supply voltage is used as the fixed voltage.

The LUT 4 has two output terminals. A signal is output to one of the output terminals via the switches S21 and S22. A signal to be input to the switch S22 is output from the other output terminal. The LUT 4 can be used as either an i-input LUT or two (i–1)-input LUTs.

The memory M100 stores information indicating whether the LUT 4 is used as an i-input LUT or as a set of two (i–1)-input LUTs. If the information stored in the memory M100 indicates that the LUT 4 is used as an i-input LUT, the multiplexer MUX1 selects an i-th input signal input to the input terminal A. At that time, the multiplexer MUX2 selects a signal input to the input terminal A, that is, the i-th input signal. Consequently, the i-th input signal is input to the gate of the switch transistor T2, while an inversion signal of the i-th input signal is input to the gate of the switch transistor T1. That is, one of the switch transistors T1 and T2 is turned on while the other is turned off according to the i-th input signal. Thus, if the LUT 4 is used as an i-th input LUT, the power supply to one of a group of memories $M\_1$ to $M\_j$ and a group of memories $M\_(j+1)$ to $M\_i$ can be shut off according to the i-th input signal, similarly to the LUT1 according to the first embodiment, thereby reducing the power consumption.

If the information stored in the memory M100 indicates that the LUT 4 is used as two (i–1)-input LUTs, the multiplexer MUX1 selects the power-supply voltage input to the input terminal B. Then, a signal representing a voltage level "Low" is input to the gate of the switch transistor T1 such that the switch transistor T1 is turned on, and a signal representing a voltage level "Low" is input to the gate of the switch transistor T2 such that the switch transistor T2 is turned on. Concurrently, the switch S21 is turned on, while the switch S22 is turned off. Therefore, information stored in one of the memories $M\_1$ to $M\_j$ selected using first to (i–1)-th input signals is output from the first output terminal, while information stored in one of the memories $M\_(j+1)$ to $M\_i$ selected using the first to (i–1)-th input signals is output from the second output terminal. That is, the LUT 4 can be used as two (i–1)-th LUTs which share input signals to switch groups SG1 and SG2.

Modification described in each of the first to third embodiments can be made to the LUT 4 according to the fourth embodiment. Alternatively, a combination of plural modifications can be applied to the LUT 4. Further alternatively, the second embodiment and the third embodiment can be combined with the fourth embodiment.

Fifth Embodiment

Figure 21:
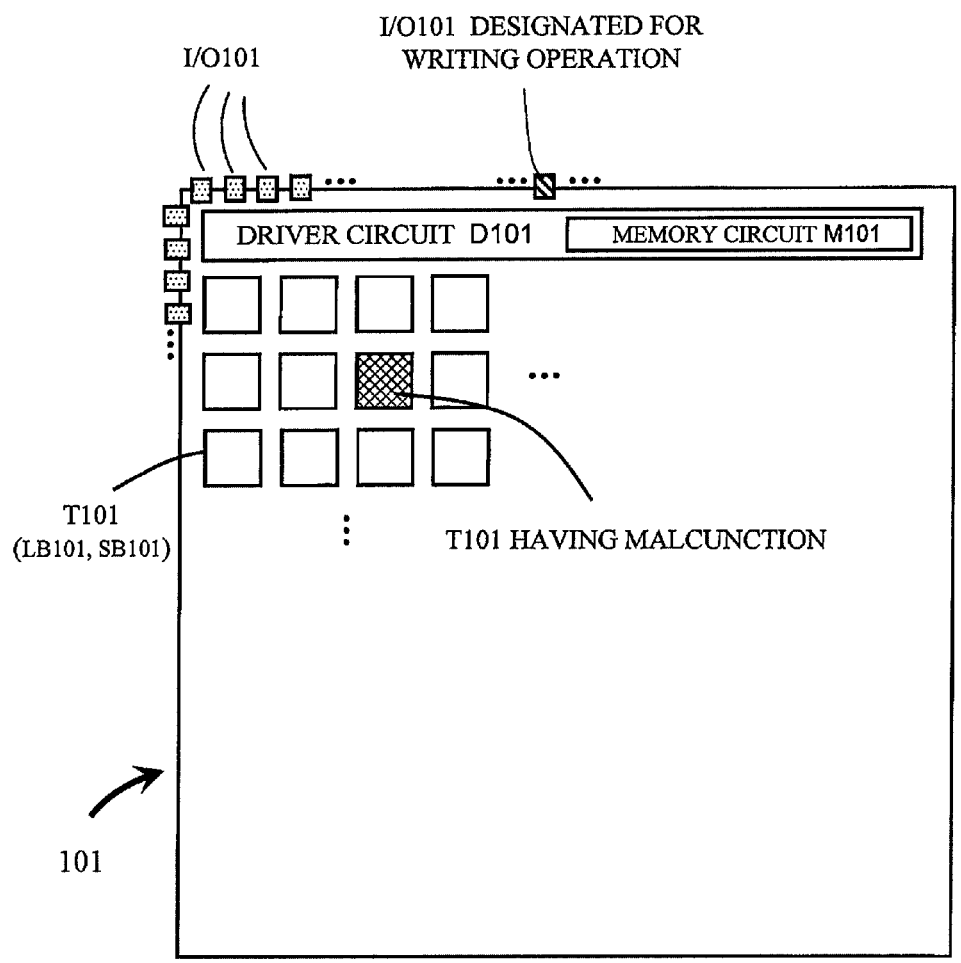
FIG. 21 illustrates a FPGA according to a fifth embodiment.

FIG. 21 illustrates a FPGA 101 according to a fifth embodiment. The FPGA 101 includes plural basic tiles T101, a driver circuit D101 and plural input-output terminals I/O101. Each basic tile T101 includes a logic block LB101 and a switch block SB101, and each logic block LB101 includes the LUT according to one of the first to fourth embodiments. The driver circuit D101 performs the input/output operation and the writing operation to the logic blocks LB101. A part of the input-output terminals I/O101 is designated as an input-output terminal for the writing operation, and the driver circuit D101 performs the writing operation to the logic blocks LB101 through the writing-operation-designated input-output terminal I/O101.

The driver circuit D101 includes a memory circuit M101. Here, in the FPGA 101, a part of the logic blocks LB101 may have a malfunction. In the present embodiment, the memory circuit M101 stores information regarding the logic block LB 101 which has the malfunction, and the driver circuit D101 performs the writing operation to the logic blocks LB 101 while referring to the information stored in the memory circuit M101. For example, if the information stored in the memory circuit M101 indicates that "one of the logic blocks LB101 has a malfunction", the driver circuit D101 performs the writing operation to the logic blocks LB101 based on the logic synthesis result while avoiding the particular logic block.

If each logic block LB101 includes the LUT according to one of the second to fourth embodiments, even if a part of the logic blocks LB has a malfunction and the LUT of the particular logic block is not operable as the i-input LUG, the LUT of the particular logic block may be still operable as the (i−1)-input LUT. In this case, for example, if the information stored in the memory circuit M101 indicates that "one of the logic blocks LB101 has a malfunction but the LUT thereof is still operable as the (i−1)-input LUT", the driver circuit D101 performs the writing operation to the logic blocks LB 101 based on the logic synthesis result while using the particular logic block as the (i−1)-input logic block.

Figure 22:
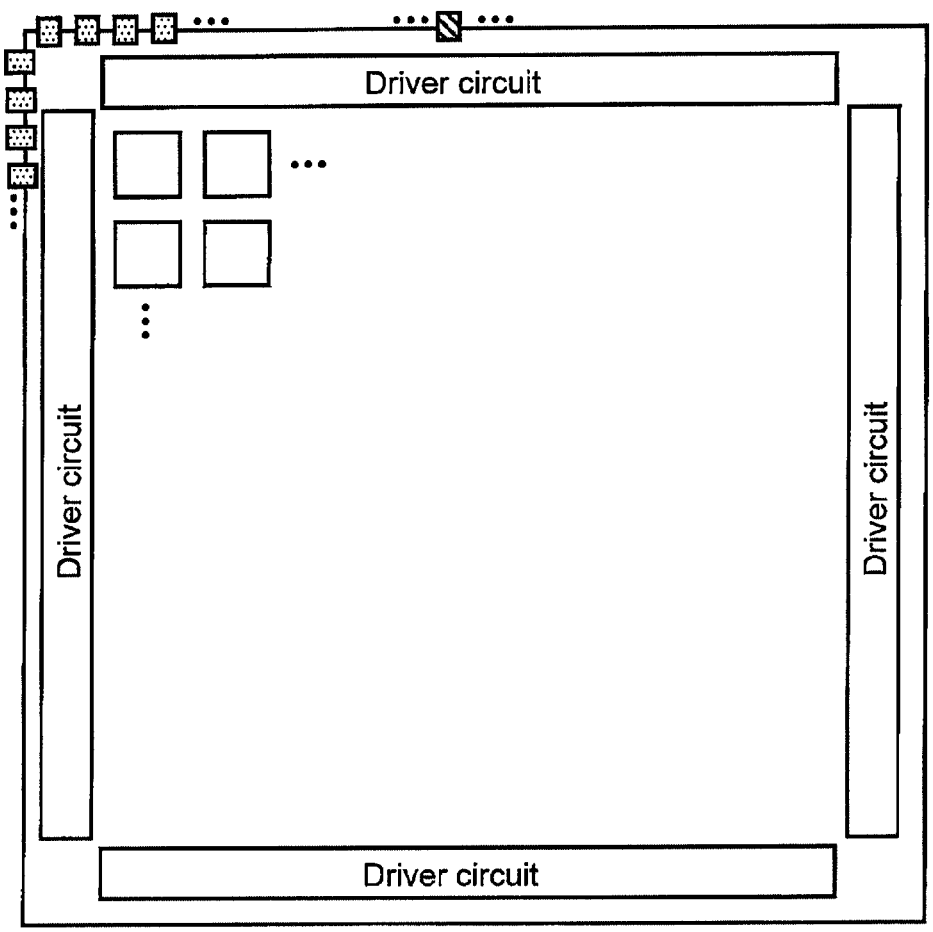
FIGS. 22 and 23 illustrate another examples of the FPGA.
Figure 23:
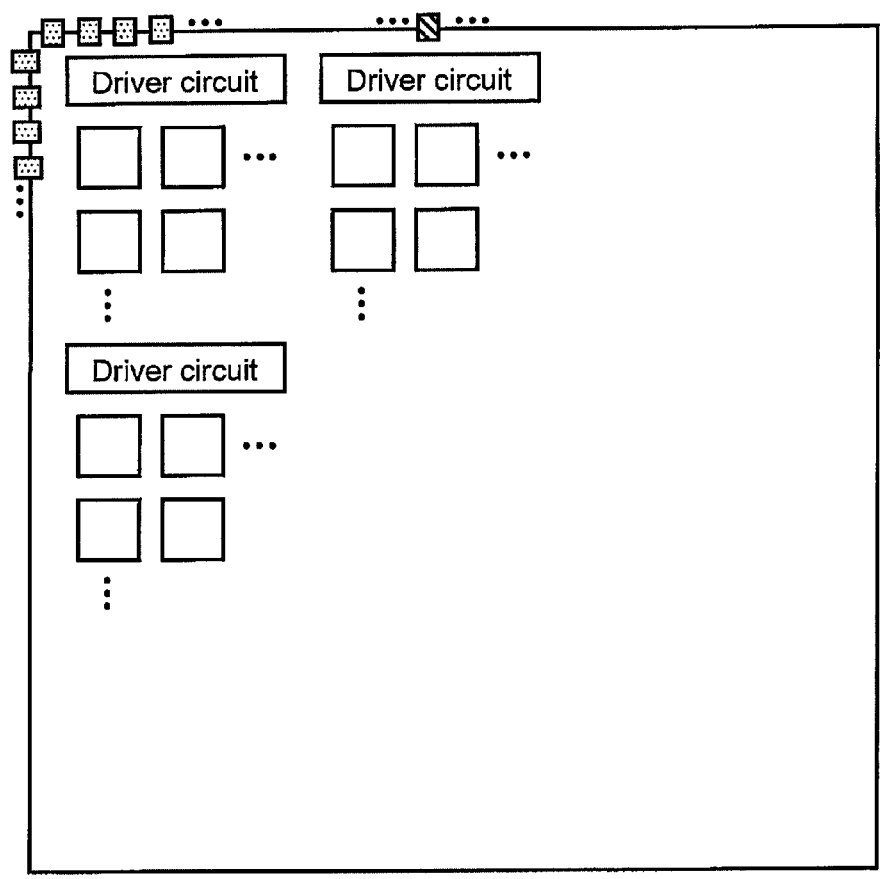

Although FIG. 21 exemplifies a case where one writing-operation-designated input-output terminal I/O101 is provided, two or more of writing-operation-designated input-output terminals may be provided. Further, two or more of driver circuits may be provided. Although FIG. 21 exemplifies a case where one driver circuit D101 is provided on a position in which the writing-operation-designated input-output terminal I/O101 is provided, a driver circuit may be provided on each side of the FPGA as exemplified in FIG. 22. Further, plural logic blocks may be divided into plural groups, and a driver circuit may be provided for each group of the logic blocks as exemplified in FIG. 23. A memory circuit may be provided in all the driver circuits or in part of the driver circuits. If plural memory circuits are provided, all the memory circuits may store the same information, or each of the memory circuits may store a corresponding one group of the logic blocks.

The invention is not limited to the above embodiments, and the embodiments can be suitably modified without departing from the scope of the invention.

The invention claimed is:

1. A look-up table circuit, comprising:
   $2^i$ memories, a half of which constituting a first memory group, the other half of which constituting a second memory group;
   first to i-th input terminals to which first to i-th input signals are input, respectively;
   a first output terminal;
   a switch group that selectively connects one of the memories to the first output terminal according to the first to i-th input signals;
   a first power-off switch that shuts off power supply to the first memory group in response to one of the first to i-th input signals; and
   a second power-off switch that shuts off power supply to the second memory group in response to the one of the first to i-th input signals.

2. The look-up table circuit of claim 1,
   wherein the switch group includes first to i-th stage switch groups to which the first to i-th input signals are input, respectively.

3. The look-up table circuit of claim 2,
   wherein, in the switch group, the first stage switch group is connected to the memories, and the i-th stage switch group is connected to the first output terminal, and
   wherein the first power-off switch and the second power-off switch shut off power supply to the first memory group and the second memory group in response to the i-th input signal which is also input to the i-th stage switch group.

4. The look-up table circuit of claim 1,
   wherein the switch group includes:
   a first multiplexer that selects one memory of the first memory group according to the first to i-th input signals;
   a second multiplexer that selects one memory of the second memory group according to the first to i-th input signals; and
   an output switch that selectively connects an output signal from the first multiplexer or an output signal from the second multiplexer to the first output terminal, according to the i-th input signal.

5. The look-up table circuit of claim 4,
   wherein the first power-off switch and the second power-off switch shut off power supply to the first memory group and the second memory group in response to the i-th input signal which is also input to the output switch.

6. The look-up table circuit of claim 1, further comprising:
   a second output terminal from which information stored in one memory of the second memory group which is selected according to the first to (i−1)-th input signals is output; and
   a multiplexer that selects a fixed voltage or the one of the first to i-th input signals,
   wherein, if the multiplexer selects the one of the first to i-th input signals, the first power-off switch and the second power-off switch are on/off controlled according to the one of the first to i-th input signals, and
   wherein, if the multiplexer selects the fixed voltage, the first power-off switch and the second power-off switch supply power to the first memory group and the second memory group, respectively.

7. The look-up table circuit of claim 1, further comprising:
   a multiplexer that selects a fixed voltage or the one of the first to i-th input signal,
   wherein, if the multiplexer selects the one of the first to i-th input signals, the first power-off switch and the second power-off switch are on/off controlled according to the one of the first to i-th input signals, and
   wherein, if the multiplexer selects the fixed voltage, at least the second power-off switch interrupts supply power to the second memory group.

8. The look-up table circuit of claim 1, further comprising:
   a multiplexer that selects a fixed voltage or the one of the first to i-th input signal,
   wherein, if the multiplexer selects the one of the first to i-th input signals, the first power-off switch and the second power-off switch are on/off controlled according to the one of the first to i-th input signals, and
   wherein, if the multiplexer selects the fixed voltage, the first power-off switch and the second power-off switch interrupt power supply to the first memory group and the second memory group.

9. The look-up table circuit of claim 1, further comprising:
third and fourth power-off switches that interrupt power supply to the memories in response to another one of the first to i-th input signals other than the one of the first to i-th input signals inputted to the first and second power-off switches.

10. The look-up table circuit of claim 9,
wherein the third power-off switch shuts off power supply to a half of the second memory group in a state where the first power-off switch shuts off power supply to the first memory group, and
wherein the fourth power-off switch shuts off power supply to a half of the first memory group in a state where the second power-off switch shuts off power supply to the second memory group.

11. A look-up table circuit to which first to i-th input signals ($2 \leq i$) are input, comprising:
$2^i$ memories, a half of which constituting a first memory group, the other half of which constituting a second memory group;
first to i-th stage switch groups, in which
the first stage switch group receives output signals from the memories and outputs a half thereof according to the first input signal, and
the k-th stage switch group ($2 \leq k \leq i-1$) receives output signals from the (k−1)-th stage switch group and outputs a half thereof according to the k-th input signal;
a first power-off switch that shuts off power supply to the first memory group in response to one of the first to i-th input signals; and
a second power-off switch that shuts off power supply to the second memory group in response to the one of the first to i-th input signals.

12. The look-up table circuit of claim 11, further comprising:
a second output terminal from which information stored in one of the memories of the second memory group which is selected according to the first to (i−1)-th input signals is output; and
a multiplexer that selects a fixed voltage or the i-th input signal,
wherein the i-th stage switch group is controlled by the fixed voltage or the i-th input signal, which is selected by the multiplexer,
wherein, if the multiplexer selects the i-th input signal, the first power-off switch and the second power-off switch are controlled according to the i-th input signal, and
wherein, if the multiplexer selects the fixed voltage, the first power-off switch and the second power-off switch supply power to the first memory group and the second memory group.

13. The look-up table circuit of claim 11, further comprising:
a multiplexer that selects a fixed voltage or the i-th input signal,
wherein the i-th stage switch group is controlled by the fixed voltage or the i-th input signal, which is selected by the multiplexer,
wherein, if the multiplexer selects the i-th input signal, the first power-off switch and the second power-off switch are controlled according to the i-th input signal, and
wherein, if the multiplexer selects the fixed voltage, at least the second power-off switch shuts off power supply to the second memory group.

14. The look-up table circuit of claim 11, further comprising:
a multiplexer that selects a fixed voltage or the i-th input signal,
wherein the i-th stage switch group is controlled by the fixed voltage or the i-th input signal, which is selected by the multiplexer,
wherein, if the multiplexer selects the i-th input signal, the first power-off switch and the second power-off switch are controlled according to the i-th input signal, and
wherein, if the multiplexer selects the fixed voltage, the first power-off switch and the second power-off switch shut off power supply to the first memory group and the second memory group.

15. The look-up table circuit of claim 11, further comprising:
a third power-off switch that shuts off power supply to a half of the first memory group and a half of the second memory group in response to the (i−1)-th input signal; and
a fourth power-off switch that shuts off the other half of the first memory group and the other half of the second memory group in response to the (i−1)-th input signal.

16. An integrated circuit, comprising:
a plurality of logic blocks each including a look-up table;
a plurality of switch blocks provided correspondingly with the logic blocks;
a plurality of input-output terminals;
a driver circuit that controls the logic blocks and the switch blocks; and
a memory circuit that stores information regarding a malfunction which exists in the look-up tables included in the logic blocks,
wherein the driver circuit performs writing to the look-up tables while referring to the information stored in the memory circuit.

17. The integrated circuit of claim 16,
wherein, if the information stored in the memory circuit indicates that one of the look-up tables has a malfunction, the driver circuit performs the writing to the look-up tables while avoiding the indicated logic block.

18. The integrated circuit of claim 16,
wherein, if the information stored in the memory circuit indicates that one of the look-up tables has a malfunction but can configure a logical function of inputs of a predetermined number, the driver circuit performs the writing to the look-up tables while designating a logical function of inputs of equal to or smaller than the indicated number.

* * * * *